united States Patent [19]

Tsai et al.

[11] Patent Number: 5,702,972
[45] Date of Patent: Dec. 30, 1997

[54] METHOD OF FABRICATING MOSFET DEVICES

[75] Inventors: Chaochieh Tsai, Taichung; Shun-Liang Hsu; Shaulin Shue, both of Hsin-Chu, all of Taiwan

[73] Assignee: Taiwan Semiconductor Manufacturing Company Ltd., Hsin-Chu, Taiwan

[21] Appl. No.: 789,716

[22] Filed: Jan. 27, 1997

[51] Int. Cl.$^6$ ............................................. H01L 21/8238
[52] U.S. Cl. .................... 437/56; 437/41 SW; 437/44; 437/59; 437/200
[58] Field of Search ........................... 437/34, 56, 57, 437/58, 59, 200, 201, 40 DM, 41 DM, 44, 41 RLD, 40 SW, 41 SW, 228 SW

[56] References Cited

U.S. PATENT DOCUMENTS

| | | | |
|---|---|---|---|
| 4,753,897 | 6/1988 | Lund et al. | 437/201 |
| 4,855,247 | 8/1989 | Ma et al. | 437/41 RLD |
| 4,981,810 | 1/1991 | Fazan et al. | 437/44 |
| 5,182,222 | 1/1993 | Malhi et al. | 437/41 DM |
| 5,183,770 | 2/1993 | Ayukawa et al. | 437/44 |
| 5,208,472 | 5/1993 | Su et al. | 257/344 |
| 5,278,100 | 1/1994 | Doan et al. | 437/200 |
| 5,472,895 | 12/1995 | Park | 437/44 |
| 5,491,099 | 2/1996 | Hsu | 437/44 |
| 5,498,555 | 3/1996 | Lin | 437/35 |
| 5,573,980 | 11/1996 | Yoo | 437/200 |

*Primary Examiner*—Michael Trinh
*Attorney, Agent, or Firm*—George O. Saile; Stephen B. Ackerman; Rosemary L. S. Pike

[57] ABSTRACT

A method for improving the source/drain resistance in the fabrication of an integrated circuit device is described. Gate electrodes are formed on the surface of a semiconductor substrate. Lightly doped regions are implanted into the semiconductor substrate using the gate electrodes as a mask. First spacers are formed on the sidewalls of the gate electrodes. Second spacers are formed on the sidewalls of the first spacers. Heavily doped source and drain regions are implanted into the semiconductor substrate using the gate electrodes and first and second spacers as a mask. Thereafter, the second spacers are removed. A titanium layer is deposited by chemical vapor deposition over the substrate whereby titanium silicide is formed overlying the gate electrodes and overlying the source and drain regions and whereby elemental titanium is deposited overlying the first spacers wherein the titanium silicide overlying the source and drain regions improves the source/drain resistance. The elemental titanium is removed. The substrate is annealed to transform all of the silicide into C54-phase TiSi$_2$ and the fabrication of the integrated circuit device is completed.

20 Claims, 4 Drawing Sheets

METHOD OF FABRICATING MOSFET DEVICES

BACKGROUND OF THE INVENTION (1) Field of the Invention

The invention relates to the fabrication of integrated circuit devices, and more particularly, to a method of reducing series resistances of LDD and contact resistance of the source/drain for sub-quarter-micron devices in the manufacture of integrated circuits.

(2) Description of the Prior Art

In the fabrication of integrated circuit devices, junction depth becomes shallower as the dimension of devices scales down. For sub-quarter micron MOSFETs, source/drain series and contact resistance significantly increases. Referring now to FIGS. 1A through 1C, there is illustrated a partially completed integrated circuit device. Gate electrodes 11 having a pitch of 0.8 micron (0.4 micron design rules) have been formed on semiconductor substrate 10. Spacers 13 of varying thicknesses have been formed on the sidewalls of the gate electrodes. In FIG. 1A, the spacers have a thickness of 2000 Angstroms. The spacers fill the area between the gates; there is no source/drain area. In FIG. 1B, the spacers have a thickness of 1500 Angstroms. There will be high source/drain resistance because the width of the source/drain region is very narrow. In FIG. 1C, the spacers have a thickness of 600 Angstroms. There will be lower source/drain resistance because of the increased width of the source/drain regions.

Also in sub-quarter micron technology, gate spacers may occupy the space for silicidation thereby reducing the silicide linewidth to below about 2000 Angstroms. C54-TiSi$_2$, having low resistance, is a desirable silicidation for sub-quarter micron technology. However, it is difficult to form C54-TiSi$_2$ as the linewidth decreases below 2000 Angstroms, possibly because of a shortage of nucleation sites.

Some workers in the field have used double spacer techniques. U.S. Pat. No. 5,208,472 to Su et al teaches a double spacer salicide MOS device. U.S. Pat. No. 5,498,555 to Lin teaches forming a first spacer of polysilicon or silicon nitride and a second spacer of silicon dioxide on the gate electrode sidewalls. U.S. Pat. No. 5,278,100 to Doan et al teaches a method of chemical vapor deposition for depositing titanium silicide.

SUMMARY OF THE INVENTION

A principal object of the present invention is to provide an effective and very manufacturable method of reducing resistance in the fabrication of integrated circuit devices.

A further object of the invention is to reduce series resistance of LDD and contact resistance of the source/drain in the fabrication of integrated circuit devices.

Another object is to improve resistance for sub-quarter micron MOSFETs.

Yet another object of the invention is to effectively grow C54-TiSi$_2$ for sub-quarter micron devices.

In accordance with the objects of this invention a method for improving the source/drain resistance in the fabrication of an integrated circuit device is achieved. Gate electrodes are formed on the surface of a semiconductor substrate. Lightly doped regions are implanted into the semiconductor substrate using the gate electrodes as a mask. First spacers are formed on the sidewalls of the gate electrodes. Second spacers are formed on the sidewalls of the first spacers. Heavily doped source and drain regions are implanted into the semiconductor substrate using the gate electrodes and first and second spacers as a mask. Thereafter, the second spacers are removed. A titanium layer is deposited by chemical vapor deposition over the substrate whereby titanium silicide is formed overlying the gate electrodes and overlying the source and drain regions and whereby elemental titanium is deposited overlying the first spacers wherein the titanium silicide overlying the source and drain regions improves the source/drain resistance. The elemental titanium is removed. The substrate is annealed to transform all of the silicide into C54-phase TiSi$_2$ and the fabrication of the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 2:
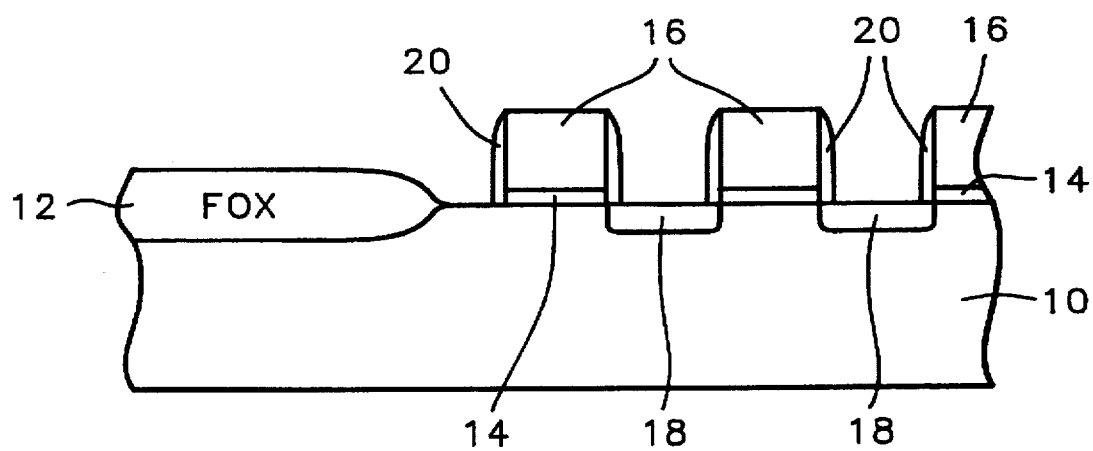
FIGS. 2 through 7 schematically illustrate in cross-sectional representation a preferred embodiment of the present invention.

Referring now more particularly to FIG. 2, there is shown an illustration of a portion of a partially completed integrated circuit device. The semiconductor substrate 10 is preferably composed of silicon having a (100) crystallographic orientation. In an effort to simplify the description and the drawings the dielectric isolation between devices has been only partially shown and will not be described in detail, because they are conventional. For example, field oxide region 12 is formed to isolate the semiconductor surface regions shown from other such regions not shown. Gate electrodes are formed as is conventional in the art. The surface of the silicon substrate 10 is thermally oxidized to form the gate oxide layer 14. The polysilicon layer 16 is deposited, for example, by low pressure chemical vapor deposition (LPCVD) to a thickness of between about 2000 and 3000 Angstroms. The polysilicon layer is etched as is conventional in the art to provide a desired pattern of gate electrodes as shown in FIG. 2. The spacing between the gate electrodes may be between about 3000 and 4000 Angstroms or less than 3000 Angstroms.

The source/drain structure of the MOS FET may now be formed by the following steps. First, the lightly doped source and drain implantations are performed. Lithographic masks may be required to protect the areas not to be subjected to the particular ion implantation. Lightly doped regions 18 are formed within the semiconductor substrate.

The key feature of the present invention will now be described; that is, a two-one double spacer scheme. First, a thin thermal oxide spacer 20 is grown on the sidewalls of the gate electrodes. The spacers have a thickness of between about 100 and 300 Angstroms.

Figure 3:
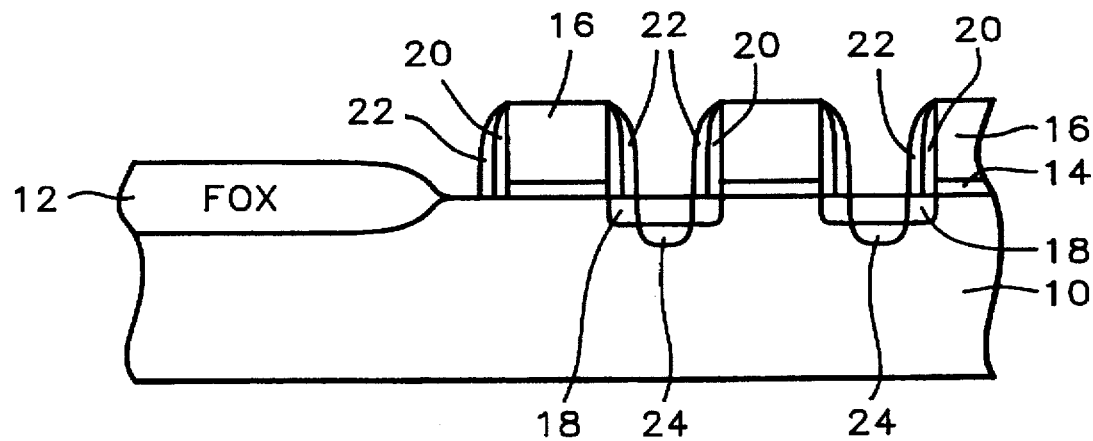

Next, a layer of silicon nitride is conformally deposited over the surface of the substrate. The layer is anisotropically etched to leave silicon nitride spacers 22 on the sidewalls of the thermal oxide spacers 20, as illustrated in FIG. 3. The silicon nitride spacers 22 have a thickness of between about 1000 and 1500 Angstroms. The silicon nitride spacers 22 have a two-fold purpose: to offer a wider window to tune the device and to offer a deeper source/drain junction depth to reduce resistance.

The heavily doped source/drain implantation is now performed using the gate electrodes and the spacers as a mask, forming source/drain regions 24 within the silicon substrate. The depth of the regions 24 is between about 1500 and 2000 Angstroms into the substrate. This is contrasted with the prior art junction depths of between about 100 and 150 Angstroms.

Figure 1A:
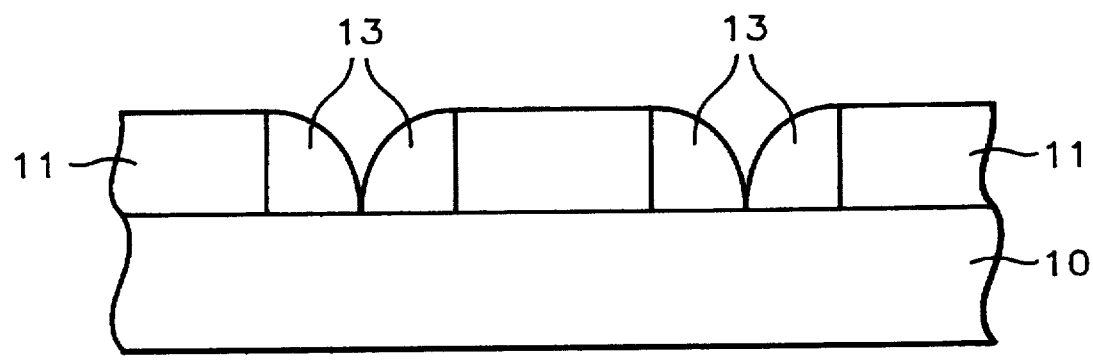
FIGS. 1A through 1C schematically illustrate in cross-sectional representation an embodiment of the prior art having varying spacer thicknesses.
Figure 1B:
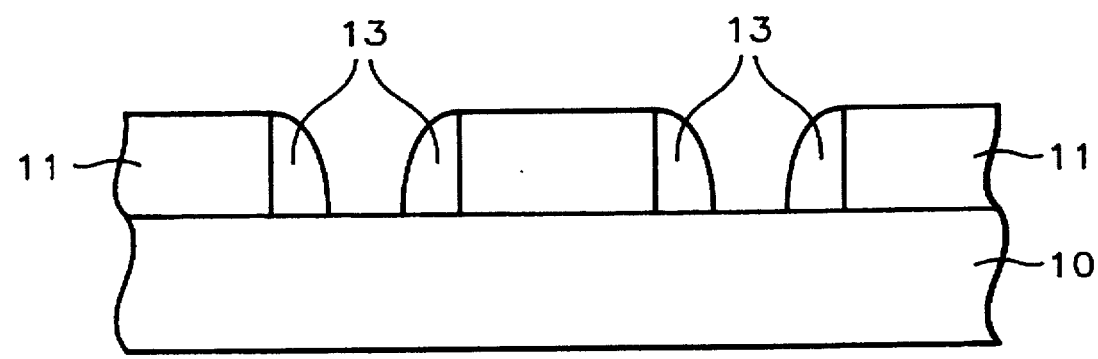
Figure 1C:
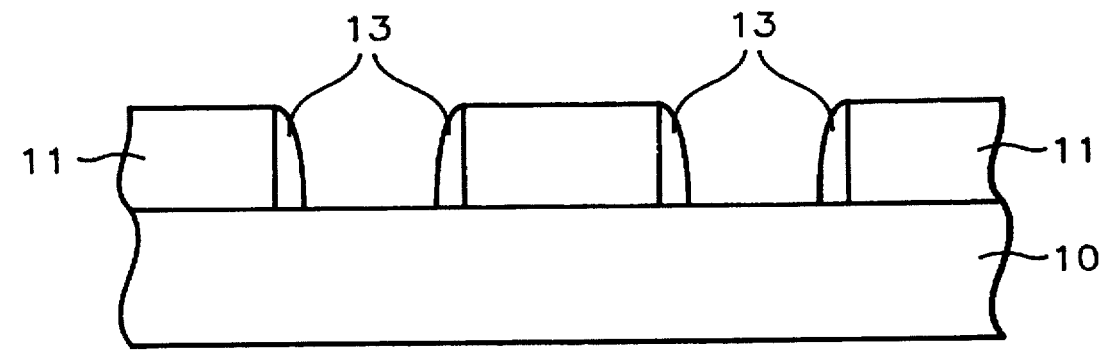
Figure 4:
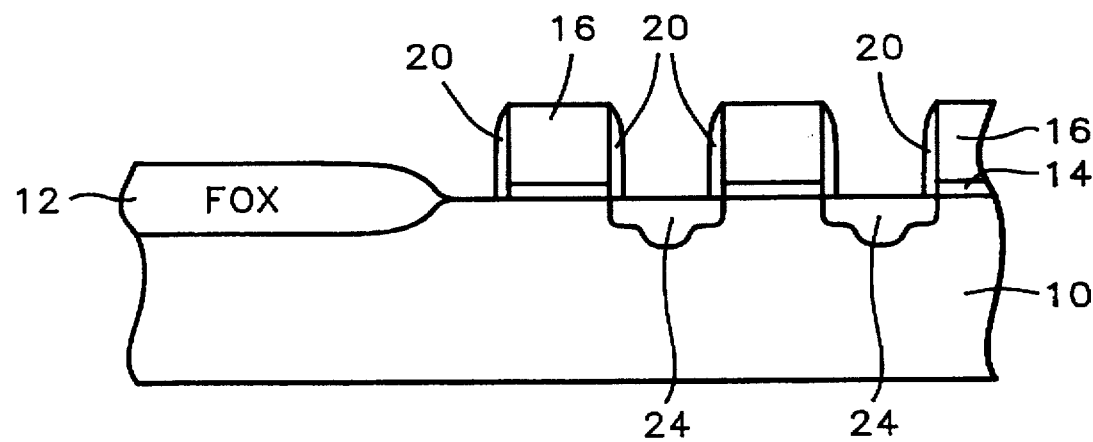

If these thick silicon nitride spacers 22 were to remain on the sidewalls of the gate electrodes, they would cause high resistance, as illustrated in FIG. 1B of the prior art. However, in the process of the present invention, these spacers 22 are now removed from the sidewalls of the gate electrodes. The thin thermal oxide spacers 20 remain, as shown in FIG. 4.

Figure 5:
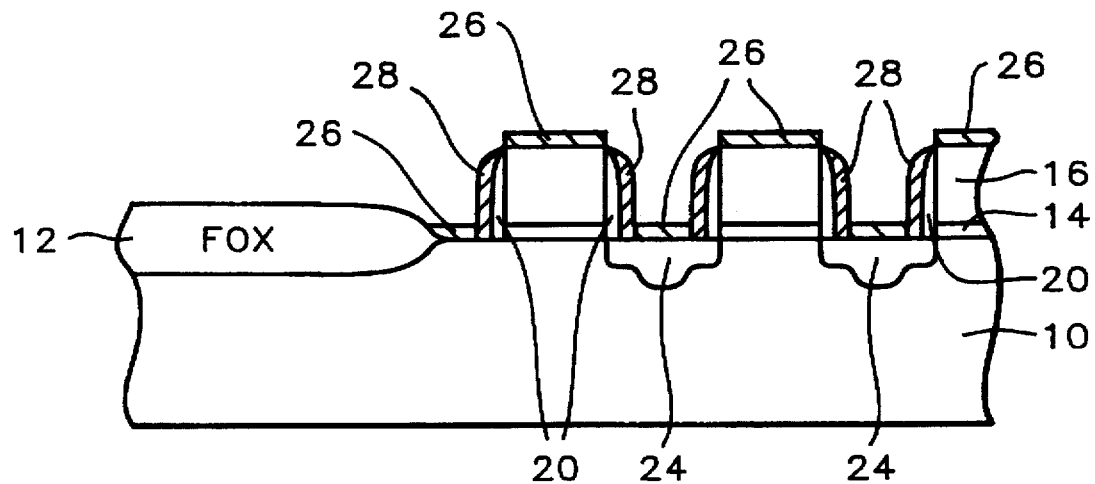

Referring now to FIG. 5, titanium is deposited by plasma enhanced chemical vapor deposition (PECVD) at a temperature of between about 400° and 700° C. to a thickness of between about 100 and 400 Angstroms over the surface of the substrate. This deposition will form C49-TiSi$_2$ 26 on the top surface of the gate electrodes and in the source/drain regions; that is, overlying the polysilicon 16 or the silicon substrate 10. Elemental titanium 28 will deposit on the thermal oxide spacers 20. In their paper, "Titanium Chemical Vapor Deposition," by J. T. Hillman et al, *VMIC Conference*, Jun. 7-8, 1994, pp. 365-366, the authors disclose that the chemical vapor deposition (CVD) of titanium onto silicon directly forms titanium silicide while CVD of titanium onto thermal oxide remains as elemental titanium.

Since the second spacers 22 have been removed before the formation of the titanium silicide over the source/drain regions, there is a larger area between the gate electrodes available for silicidation. This allows the linewidth of the titanium silicide to increase thereby reducing sheet resistance. The silicide overlying the LDD regions reduces the series resistance of the LDD and reduces the contact resistance of the source/drain.

The elemental titanium layer 28 on the spacers 20 is removed, for example, by a solution of $NH_4OH:H_2O_2:H_2O$.

Figure 6:
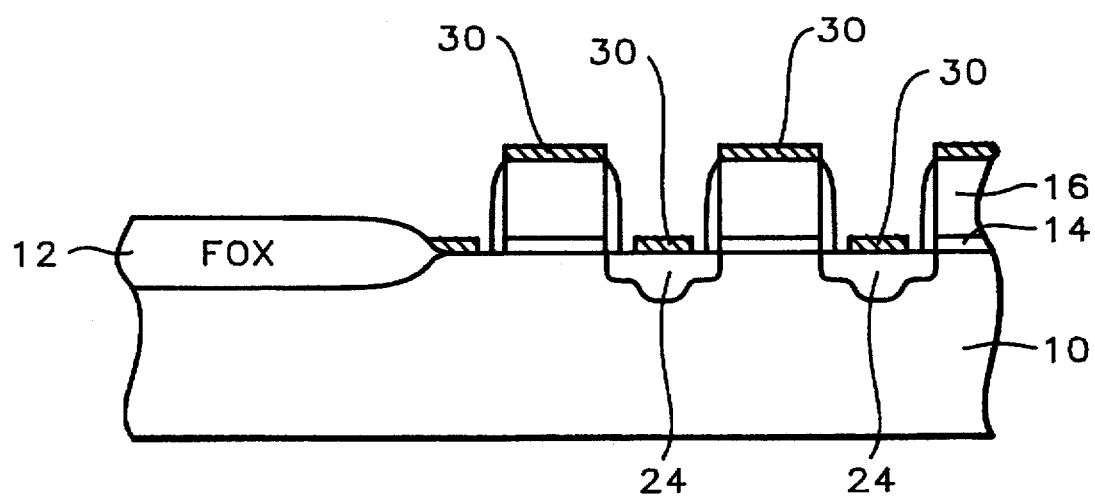

The substrate is annealed using a rapid thermal annealing (RTA) process at a temperature of between about 740° and 900° C. in a nitrogen ambient to transform the C49-TiSi$_2$ 26 to C54-TiSi$_2$ 30, as illustrated in FIG. 6. The resistance of C54-TiSi$_2$ is lower than that of the C$_{49}$ phase, and hence is desired.

Figure 7:
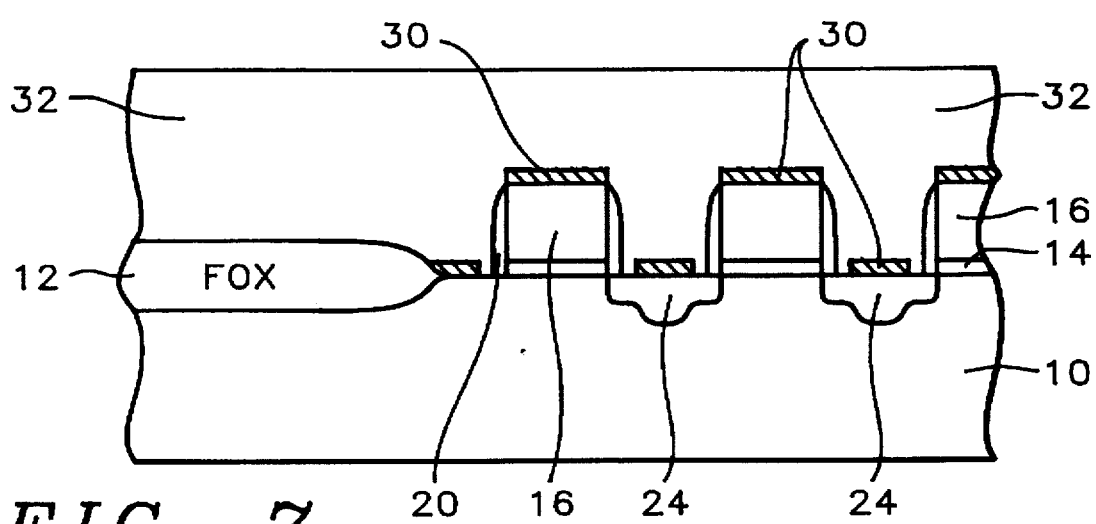
Figure 8:
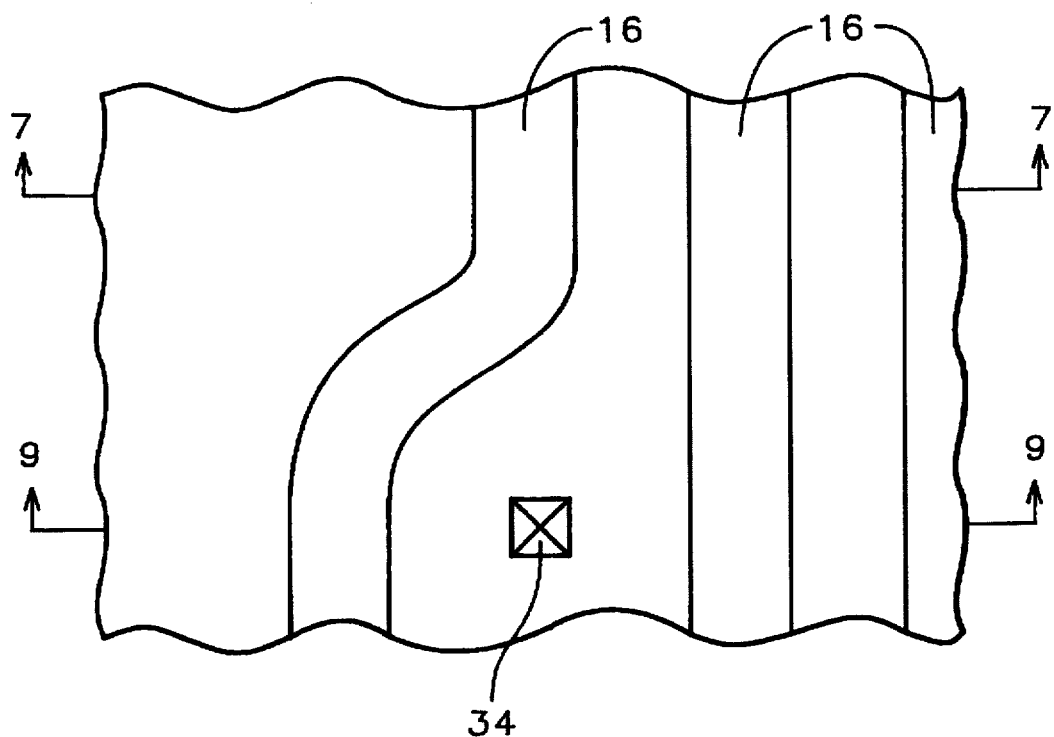
FIG. 8 illustrates a top view of a preferred embodiment of the present invention according to views 7—7 of FIG. 7 and view 9—9 of FIG. 9.
Figure 9:
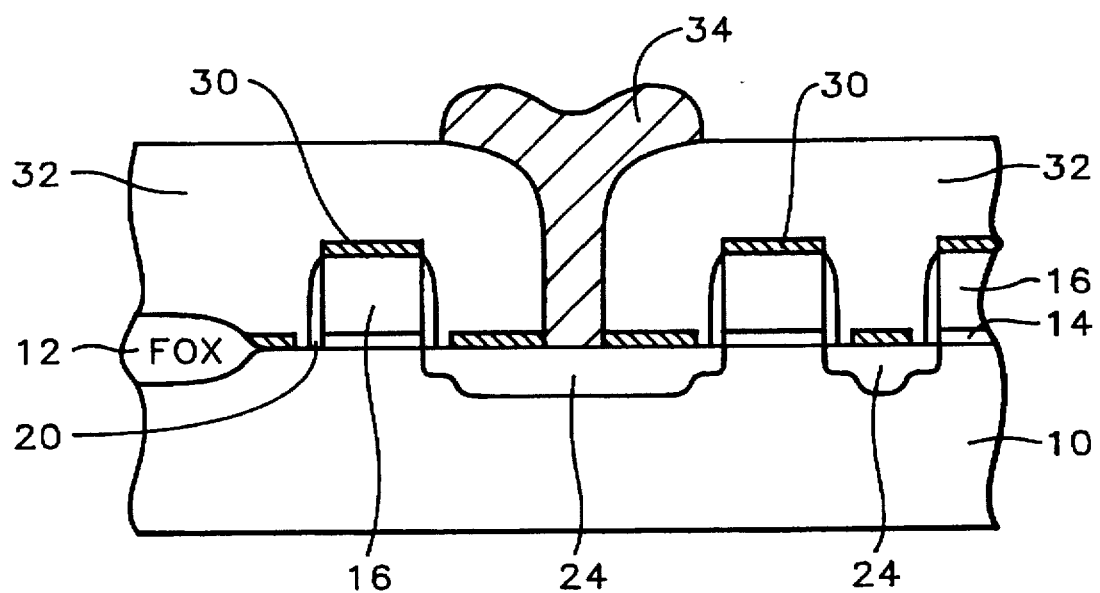
FIG. 9 schematically illustrates in cross-sectional representation a completed integrated circuit device of the present invention.

Processing continues as is conventional in the art. For example, as shown in FIG. 7, a thick insulating layer 32 of borophosphosilicate glass (BPSG), or the like, is blanket deposited over the substrate. No contacts will be placed in the narrow width device region. Referring to FIG. 8, a top view of FIG. 7, it can be seen that the device regions are wider in view 9—9 of the device. This view is illustrated in cross section in FIG. 9. There, contact openings are etched through the thick insulating layer 32 to the underlying gate electrodes 16 or source and drain regions 24. A conducting layer 34 is deposited within the contact openings and patterned to complete the electrical connections in the fabrication of the integrated circuit device.

The process of the invention provides an effective and very manufacturable method for improving series and contact resistance in sub-quarter micron MOSFETs. The desirable C54-TiSi$_2$ material having low resistance can be used for silicidation over the LDD and source/drain regions using the process of the present invention where the linewidths are as small as 0.13 to 0.35 micron.

While the invention has been particularly shown and described with reference to the preferred embodiments thereof, it will be understood by those skilled in the art that various changes in form and details may be made without departing from the spirit and scope of the invention.

What is claimed is:

1. A method of reducing source and drain resistance in the fabrication of an integrated circuit device comprising the steps of:

providing gate electrodes on the surface of a semiconductor substrate;

implanting lightly doped regions into said semiconductor substrate using said gate electrodes as a mask;

forming first insulating spacers on the sidewalls of said gate electrodes;

forming second insulating spacers on the sidewalls of said first spacers;

implanting heavily doped source and drain regions into said semiconductor substrate using said gate electrodes and said first and second spacers as a mask;

thereafter removing said second spacers;

depositing by chemical vapor deposition a titanium layer over said substrate whereby titanium silicide is formed overlying said gate electrodes and overlying said source and drain regions and whereby elemental titanium is deposited overlying said first spacers wherein said titanium silicide overlying said source and drain regions reduces said source and drain resistance;

removing said elemental titanium; and completing the fabrication of said integrated circuit device, including the step of depositing an insulating layer overlying said gate electrodes and said titanium silicide.

2. The method according to claim 1 wherein said gate electrodes are composed of polysilicon.

3. The method according to claim 1 wherein said first spacers are formed by growing a thermal oxide layer on the sidewalls of said gate electrodes to a thickness of between about 100 and 300 Angstroms.

4. The method according to claim 1 wherein said second spacers are formed by depositing a layer of silicon nitride over the surface of said substrate and anisotropically etching away said silicon nitride layer to leave said silicon nitride layer as said second spacers on said sidewalls of said first spacers wherein said second spacers have a thickness of between about 1000 and 1500 Angstroms.

5. The method according to claim 1 wherein said depositing said titanium layer is done at a temperature of between about 400° and 700° C. to a thickness of between about 100 and 400 Angstroms.

6. The method according to claim 1 wherein said titanium silicide as deposited comprises C49-TiSi$_2$ and further comprising annealing said substrate to transform said titanium silicide to C54-TiSi$_2$ after said removing said elemental titanium.

7. The method according to claim 1 wherein the space between said gate electrodes is as small as 0.13 to 0.35 micron.

8. The method according to claim 1 wherein the junction depth of said source and drain regions is between about 1500 and 2000 Angstroms.

9. A method of reducing source and drain resistance in the fabrication of an integrated circuit device comprising the steps of:

provaiding gate electrodes on the surface of a semiconductor substrate;

implanting lightly doped regions into said semiconductor substrate using said gate electrodes as a mask;

forming first insulating spacers on the sidewalls of said gate electrodes;

forming second insulating spacers on the sidewalls of said first spacers;

implanting heavily doped source and drain regions into said semiconductor substrate using said gate electrodes and said first and second spacers as a mask;

thereafter removing said second spacers;

depositing by chemical vapor deposition a titanium layer over said substrate whereby titanium silicide is formed overlying said gate electrodes and overlying said source and drain regions and whereby elemental titanium is deposited overlying said first spacers wherein said titanium silicide overlying said source and drain regions reduces said source and drain resistance;

removing said elemental titanium;

annealing said substrate to transform said titanium silicide from C49 phase to C54 phase titanium silicide;

depositing an insulating layer overlying said gate electrodes and said titanium silicide;

etching contact openings through said insulating layer to said underlying gate electrodes and source and drain regions; and filling said contact openings with a conducting layer and patterning said conducting layer to complete the fabrication of said integrated circuit device.

10. The method according to claim 9 wherein said gate electrodes are composed of polysilicon.

11. The method according to claim 9 wherein said first spacers are formed by growing a thermal oxide layer on the sidewalls of said gate electrodes to a thickness of between about 100 and 300 Angstroms.

12. The method according to claim 9 wherein said second spacers are formed by depositing a layer of silicon nitride over the surface of said substrate and anisotropically etching away said silicon nitride layer to leave said silicon nitride layer as said second spacers on said sidewalls of said first spacers wherein said second spacers have a thickness of between about 1000 and 1500 Angstroms.

13. The method according to claim 9 wherein said depositing said titanium layer is done at a temperature of between about 400° and 700° C. to a thickness of between about 100 and 400 Angstroms.

14. The method according to claim 9 wherein said titanium silicide as deposited comprises $C49\text{-}TiSi_2$ and wherein said annealing at a temperature of between about 800° and 900° C. transforms said titanium silicide to $C54\text{-}TiSi_2$.

15. The method according to claim 9 wherein the space between said gate electrodes is as small as 0.13 to 0.35 micron.

16. The method according to claim 1 wherein the junction depth of said source and drain regions is between about 1500 and 2000 Angstroms.

17. A method of reducing source and drain resistance in the fabrication of an integrated circuit device comprising the steps of:

providing polysilicon gate electrodes on the surface of a semiconductor substrate;

implanting lightly doped regions into said semiconductor substrate using said gate electrodes as a mask;

growing first thermal oxide insulating spacers on the sidewalls of said gate electrodes;

depositing a layer of silicon nitride over the surface of said substrate and anisotropically etching to leave said silicon nitride layer as second insulating spacers on the sidewalls of said first spacers;

implanting heavily doped source and drain regions into said semiconductor substrate using said gate electrodes and said first and second spacers as a mask;

thereafter removing said second spacers;

depositing by chemical vapor deposition a titanium layer over said substrate whereby $C49\text{-}TiSi_2$ is formed overlying said gate electrodes and overlying said source and drain regions and whereby elemental titanium is deposited overlying said first spacers;

removing said elemental titanium;

annealing said substrate to transform said $C49\text{-}TiSi_2$ into $C54\text{-}TiSi_2$ wherein said $C54\text{-}TiSi_2$ overlying said source and drain regions reduces said source and drain resistance;

depositing an insulating layer overlying said gate electrodes and said $C54\text{-}TiSi_2$;

etching contact openings through said insulating layer to said underlying gate electrodes and source and drain regions; and filling said contact openings with a conducting layer and patterning said conducting layer to complete the fabrication of said integrated circuit device.

18. The method according to claim 17 wherein said first spacers have a thickness of between about 100 and 300 Angstroms.

19. The method according to claim 17 wherein said second spacers have a thickness of between about 1000 and 1500 Angstroms.

20. The method according to claim 17 wherein the space between said gate electrodes is as small as 0.13 to 0.35 micron.

* * * * *